(12) United States Patent
Liu et al.

(10) Patent No.: US 10,656,445 B2
(45) Date of Patent: May 19, 2020

(54) DISPLAY DEVICE AND MANUFACTURING METHOD THEREOF

(71) Applicant: E Ink Holdings Inc., Hsinchu (TW)

(72) Inventors: Chia-I Liu, Hsinchu (TW);
Cheng-Hang Hsu, Hsinchu (TW);
Hsin-Tao Huang, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 134 days.

(21) Appl. No.: 15/597,167

(22) Filed: May 17, 2017

(65) Prior Publication Data
US 2018/0031884 A1    Feb. 1, 2018

(30) Foreign Application Priority Data

Jul. 29, 2016    (TW) .............................. 105124130 A

(51) Int. Cl.
*G02B 26/00* (2006.01)
*G02F 1/133* (2006.01)
(Continued)

(52) U.S. Cl.
CPC .... *G02F 1/13306* (2013.01); *G02F 1/133345* (2013.01); *G02F 1/167* (2013.01); *H01L 27/3227* (2013.01); *G02F 2001/13324* (2013.01); *G02F 2001/133357* (2013.01); *G02F 2001/133388* (2013.01); *G02F 2201/503* (2013.01)

(58) Field of Classification Search
CPC .............. H01L 27/3227; H01L 31/046; H01L 51/5246; G02B 27/1066; G02F 1/13306; G02F 1/133; G02F 2001/13324

USPC ................. 136/243, 244; 257/E27.125, 447; 345/1.3, 207, 296; 359/296
See application file for complete search history.

(56) References Cited

U.S. PATENT DOCUMENTS 6,452,088 B1    9/2002    Schmidt
8,334,863 B2    12/2012    Nathan et al.
(Continued)

FOREIGN PATENT DOCUMENTS

CN          1490648 A    4/2004
CN          1886447 B    4/2011
(Continued)

OTHER PUBLICATIONS

Corresponding Taiwanese office action dated Dec. 6, 2016.
Corresponding Chinese office action dated Apr. 2, 2020.

*Primary Examiner* — Mahidere S Sahle
(74) *Attorney, Agent, or Firm* — CKC & Partners Co., LLC

(57) ABSTRACT

A display device includes a transparent cover, a photovoltaic conversion layer, a display module, and a planarization layer. The transparent cover has a visible region and an edge region that surrounds the visible region. The photovoltaic conversion layer is located on the edge region of the transparent cover. A stage difference is formed by the photovoltaic conversion layer and the visible region of the transparent cover. The display module is electrically connected to the photovoltaic conversion layer. The planarization layer is located between the display module and the photovoltaic conversion layer, and is located between the display module and the visible region of the transparent cover. The thickness of the planarization layer is greater than the stage difference.

13 Claims, 4 Drawing Sheets

(51) Int. Cl.
*G02F 1/1333* (2006.01)
*G02F 1/167* (2019.01)
*H01L 27/32* (2006.01)

(56) References Cited

U.S. PATENT DOCUMENTS

| | | |
|---|---|---|
| 8,368,729 B2 | 2/2013 | Watanabe |
| 9,281,132 B2 | 3/2016 | Logunov et al. |
| 2011/0221723 A1* | 9/2011 | Kurokawa ............... G06F 3/042 345/207 |
| 2012/0132245 A1* | 5/2012 | Kim ........................ B60J 1/00 136/244 |
| 2014/0152632 A1 | 6/2014 | Shedletsky et al. |

FOREIGN PATENT DOCUMENTS

| | | |
|---|---|---|
| CN | 102738080 A | 10/2012 |
| CN | 103474452 A | 12/2013 |
| CN | 104793796 A | 7/2015 |
| CN | 105027677 A | 11/2015 |
| TW | M416814 U | 11/2011 |
| TW | I422908 B | 1/2014 |
| TW | 201602704 A | 1/2016 |

\* cited by examiner

DISPLAY DEVICE AND MANUFACTURING METHOD THEREOF

RELATED APPLICATIONS

This application claims priority to Taiwan Application Serial Number 105124130, Jul. 29, 2016, which is herein incorporated by reference.

BACKGROUND

Field of Invention

The present invention relates to a display device and a manufacturing method of the display device.

Description of Related Art

In a market full of a wide variety of consumer electronic products, flat display devices have been extensively utilized as display screens in electronic products, such as liquid crystal display (LCD) devices, organic light emitting diode (OLED) display devices, electrophoresis display (EPD) devices, etc. In order to improve user convenience, solar cells may be considered to be used in a display device, such that light energy is converted into electrical energy to provide power to a display device.

However, solar cells with high conversion efficiency are opaque, and cannot be directly stacked on a display region of a display device that requires light permeability. Although light-permeable solar cells have been developed in recent years, their principles reside in removing most of photovoltaic (PV) components to meet the requirement of sufficient light permeability. For example, a display device needs a light permeability greater than 60%. As a result, the energy conversion efficiency of the solar cells is reduced. Moreover, the solar cells stacked on the display device cause the display screens to have the adverse effects of low brightness or shadows.

In other words, it is difficult for applications of the solar cells on the display device to simultaneously take optical properties (such as the light permeability of the display device) and photoelectric conversion efficiency into consideration.

SUMMARY

An aspect of the present invention is to provide a display device.

According to an embodiment of the present invention, a display device includes a transparent cover, a photovoltaic conversion layer, a display module, and a planarization layer. The transparent cover has a visible region and an edge region that surrounds the visible region. The photovoltaic conversion layer is located on the edge region of the transparent cover. A stage difference is formed by the photovoltaic conversion layer and the visible region of the transparent cover. The display module is electrically connected to the photovoltaic conversion layer. The planarization layer is located between the display module and the photovoltaic conversion layer, and is located between the display module and the visible region of the transparent cover. The thickness of the planarization layer is greater than the stage difference.

In one embodiment of the present invention, the stage difference is in a range from 1 μm to 5 μm.

In one embodiment of the present invention, the thickness of the planarization layer is in a range from 10 μm to 150 μm.

In one embodiment of the present invention, a recess is defined by the transparent cover and the photovoltaic conversion layer, and the recess is filled with the planarization layer.

In one embodiment of the present invention, the planarization layer is adhesive.

In one embodiment of the present invention, the planarization layer is made of a material comprising an ultraviolet (UV) cut material.

In one embodiment of the present invention, the display module is a reflective display.

In one embodiment of the present invention, the display module includes an electrophoresis module. The electrophoresis module is located on a side of the planarization layer facing away from the transparent cover, and is electrically connected to the photovoltaic conversion layer through a power management system.

In one embodiment of the present invention, the display device further includes a front light module. The front light module is located between the planarization layer and the display module, and is electrically connected to the photovoltaic conversion layer through a power management system.

In one embodiment of the present invention, the display device further includes a touch module. The touch module is located between the planarization layer and the display module.

In one embodiment of the present invention, the transparent cover is made of a glass or polymer material.

In one embodiment of the present invention, the photovoltaic conversion layer includes solar cells.

Another aspect of the present invention is to provide a manufacturing method of a display device.

According to an embodiment of the present invention, a manufacturing method of a display device includes the following steps. A photovoltaic conversion layer is formed to cover a surface of a transparent cover, and the surface of the transparent cover has a visible region and an edge region. The photovoltaic conversion layer is patterned to remove the photovoltaic conversion layer that is on the visible region. A planarization layer is formed to cover the photovoltaic conversion layer and the visible region of the transparent cover. A display module is disposed on the planarization layer.

In one embodiment of the present invention, the manufacturing method further includes electrically connecting the photovoltaic conversion layer to the display module through a power management system.

In one embodiment of the present invention, the planarization layer is made of an adhesive material, and is made of material including an UV cut material, and the display module is adhered to the transparent cover through the planarization layer.

In the aforementioned embodiment of the present invention, since the photovoltaic conversion layer is located on the edge region of the transparent cover, the photovoltaic conversion layer may be protected by the transparent cover, and light may pass through the transparent cover and is absorbed by the photovoltaic conversion layer. Moreover, because having an opaque or translucent property, the photovoltaic conversion layer may replace a typical light shielding ink surrounding a display region as the frame of the display region. In addition, the planarization layer is located between the display module and the photovoltaic conversion layer, and is located between the display module and the visible region of the transparent cover, such that the stage difference formed by the photovoltaic conversion layer and the visible region of the transparent cover may be filled with the planarization layer. The planarization layer may be adhesive to adhere to the display module. Furthermore, the planarization layer may have the capability of cutting ultraviolet (UV-cut) without needing to use a UV-cut transparent cover, thus saving cost.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
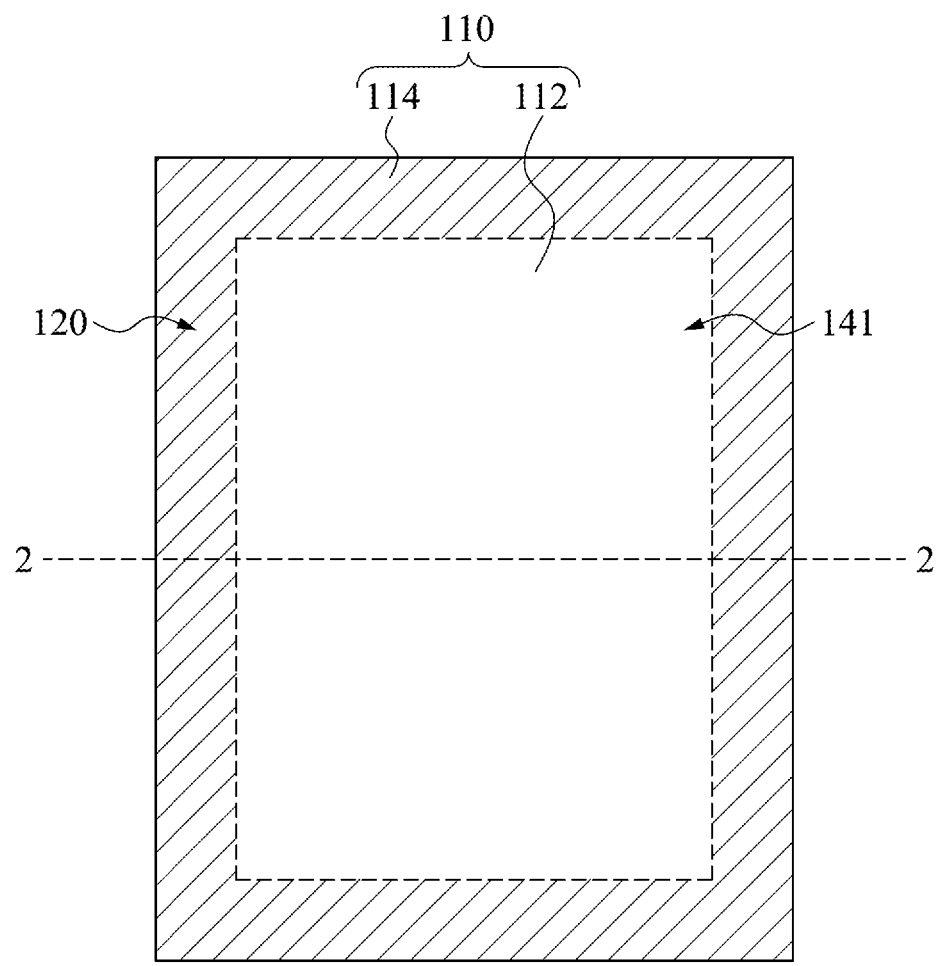
FIG. 1 is a top view of a display device according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 2:
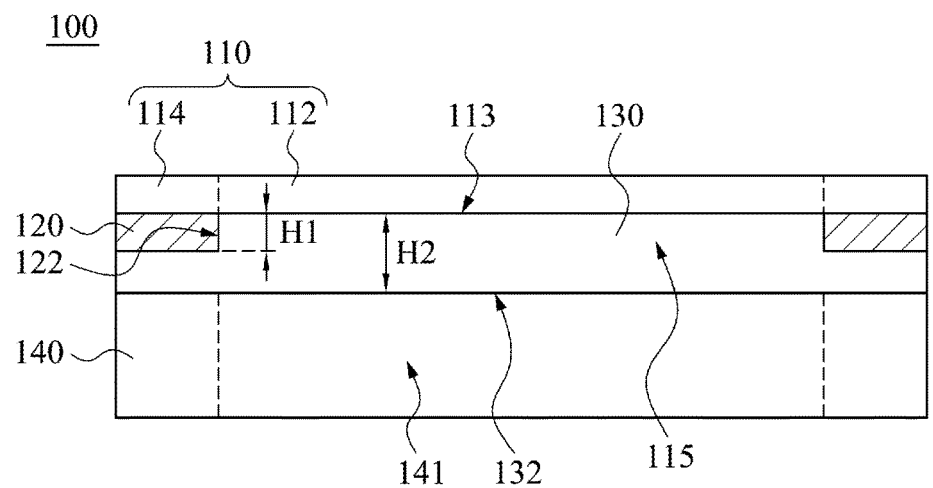
FIG. 2 is a cross-sectional view of the display device taken along line 2-2 shown in FIG. 1.

FIG. 1 is a top view of a display device 100 according to one embodiment of the present invention. FIG. 2 is a cross-sectional view of the display device 100 taken along line 2-2 shown in FIG. 1. As shown in FIG. 1 and FIG. 2, the display device 100 includes a transparent cover 110, a photovoltaic conversion layer 120, a planarization layer 130, and a display module 140. The transparent cover 110 has a visible region 112 and an edge region 114. In the figures, the visible region 112 is located at the central area of the transparent cover 110, and the edge region 114 surrounds the visible region 112. In other embodiments, the visible region 112 may be located at any position of the transparent cover 110, and the edge region 114 may be located at any side of the visible region 112. As shown in FIG. 2, the visible region 112 is an area shown between two dotted lines of the transparent cover 110, and the edge region 114 is an area shown outside the two dotted lines of the transparent cover 110. The photovoltaic conversion layer 120 is located on the edge region 114 of the transparent cover 110 and surrounds the visible region 112. A stage difference H1 is formed by the photovoltaic conversion layer 120 and the visible region 112 of the transparent cover 110. In other words, the stage difference H1 is the thickness of the photovoltaic conversion layer 120. The planarization layer 130 is located between the display module 140 and the photovoltaic conversion layer 120, and is located between the display module 140 and the visible region 112 of the transparent cover 110. The thickness H2 of the planarization layer 130 is greater than the stage difference H1. In this embodiment, the thickness H2 of the planarization layer 130 may be referred to as a distance between the transparent cover 110 and the display module 140.

In addition, the display module 140 is electrically connected to the photovoltaic conversion layer 120 through a power management system (not shown). The display module 140 has a display region 141 shown between two dotted lines of the display module 140 shown in FIG. 2. The orthogonal projection of the visible region 112 of the transparent cover 110 on the display module 140 overlaps with the display region 141. In this embodiment, the photovoltaic conversion layer 120 surrounds the display region 141 and does not overlap with the display region 141, thereby improving the image quality of the display region 141. However, the photovoltaic conversion layer 120 may also be configured in accordance with display requirements for the display region 141 of the display module 140.

Because being located on the edge region 114 of the transparent cover 110, the photovoltaic conversion layer 120 may be protected by the transparent cover 110. As a result, the transparent cover 110 prevents the photovoltaic conversion layer 120 from being damaged by an external force, and prevents moisture or dust from entering the photovoltaic conversion layer 120. In operation, light may pass through the transparent cover 110 and is absorbed by the photovoltaic conversion layer 120, and the photovoltaic conversion layer 120 may convert light energy into electrical energy, thereby providing power to the display module 140 that is electrically connected to the photovoltaic conversion layer 120.

Furthermore, the photovoltaic conversion layer 120 includes solar cells. The photovoltaic conversion layer 120 may show blue black or another color, such as red brown, but the present invention is not limited in this regard. The light permeability of the photovoltaic conversion layer 120 is smaller than that of the transparent cover 110. Because having an opaque or translucent property, the photovoltaic conversion layer 120 may replace a typical light shielding ink surrounding the display region 140 as the frame of the display region 140.

In addition, the stage difference H1 formed by the photovoltaic conversion layer 120 and the visible region 112 of the transparent cover 110 may be filled with the planarization layer 130 that is located between the display module 140 and the photovoltaic conversion layer 120 and between the display module 140 and the visible region 112 of the transparent cover 110. In this embodiment, the planarization layer 130 may be adhesive for adhering the display module 140. For example, the planarization layer 130 may be made of a material including an optical clear adhesive. Furthermore, the planarization layer 130 may have the capability of cutting ultraviolet (UV-cut). For example, the planarization layer 130 may be made of a material including an UV-cut material. As a result of such configuration, the display device 100 having the planarization layer 130 does not need to use an additional adhesive layer and a UV-cut transparent cover to adhere the display module 140, and has UV-cut capability, thereby saving material cost and manufacturing cost.

In this embodiment, the thickness of the photovoltaic conversion layer 120 (i.e., the stage difference H1) may be in a range from 1 μm to 5 μm, and the thickness H2 of the planarization layer 130 may be in a range from 10 μm to 150 μm, thereby facilitating thinning of the display device 100. Moreover, the transparent cover 110 may be made of a glass or polymer material. The display module 140 may be a reflective display (e.g., an electrophoresis display), an organic light emitting diode (OLED) display, or a backlight display (e.g., a liquid crystal display), and the present invention is not limited in this regard.

Furthermore, a recess 115 may be defined by a surface 113 of the transparent cover 110 and a sidewall 122 of the photovoltaic conversion layer 120. The recess 115 is filled with the planarization layer 130, and the planarization layer 130 covers the photovoltaic conversion layer 120, such that the display module 140 may be adhered to the entire surface 132 of the planarization layer 130. In this embodiment, the surface 132 of the planarization layer 130 is a substantially horizontal surface.

Figure 3:
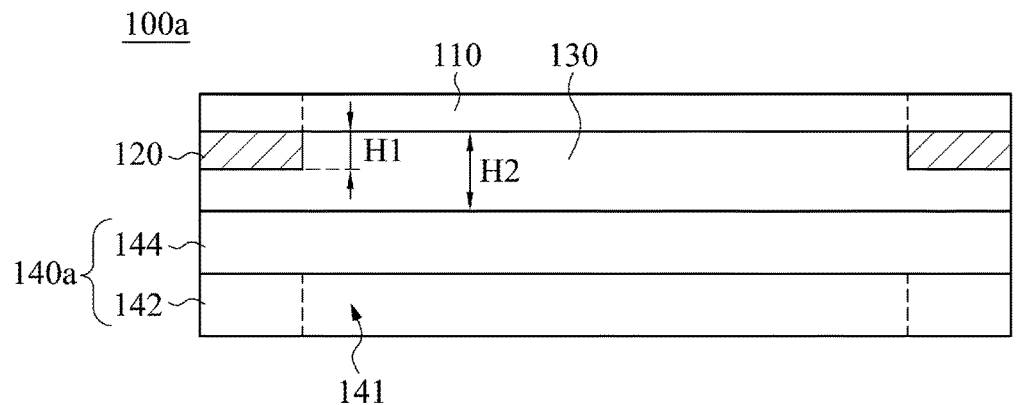
FIG. 3 is a cross-sectional view of a display device according to one embodiment of the present invention.

FIG. 3 is a cross-sectional view of a display device 100a according to one embodiment of the present invention. It is noted that the connection relationships and materials of the aforementioned elements will not be described again in the following description. The display device 100a includes the transparent cover 110, the photovoltaic conversion layer 120, the planarization layer 130, and a display module 140a. In this embodiment, the display module 140a is a reflective display, and the display module 140a includes an electrophoresis module 142 and a front light module 144. The electrophoresis module 142 is located on a side of the planarization layer 130 facing away from the transparent cover 110, and the front light module 144 is located between the planarization layer 130 and the electrophoresis module 142. Moreover, the electrophoresis module 142 and the front light module 144 are electrically connected to the photovoltaic conversion layer 120 through a power management system (not shown). For example, electrical power generated by the photovoltaic conversion layer 120 may be delivered to the power management system, and then the power management system provides electrical power to the electrophoresis module 142 and the front light module 144. Since the photovoltaic conversion layer 120 is located on the edge region 114 of the transparent cover 110, the image quality of the display region 141 is not affected.

In this embodiment, the front light module 144 may provide incident light to the electrophoresis module 142, such that the display device 100a may still be used in an environment with insufficient light.

In this embodiment, the electrophoresis module 142 includes an array substrate and a display medium layer. The display medium layer has plural microcapsules, and each of the microcapsules has plural black particles and plural white particles. When an electric field in the electrophoresis module 142 controls the white particles to move upward and controls the black particles to move downward, light entering the electrophoresis module 142 may be reflected by the display medium layer, such that users outside the transparent cover 110 may see displayed images. The light entering the electrophoresis module 142 may be ambient light outside the transparent cover 110 or may be light generated by the front light module 144.

In this embodiment, the planarization layer 130 is located between the front light module 144 and the transparent cover 110. The planarization layer 130 may be adhesive and have UV-cut capability, thereby saving the material and manufacturing costs of the display device 100a.

Figure 4:
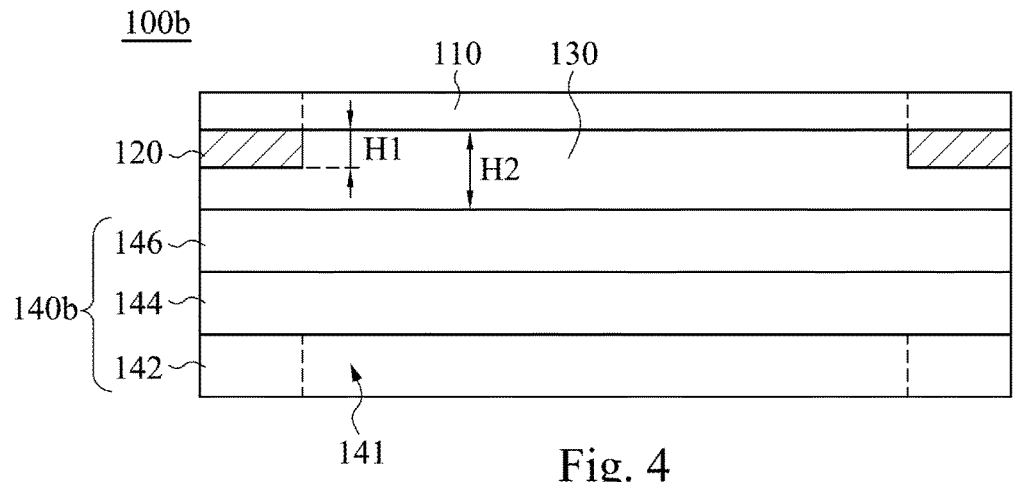
FIG. 4 is a cross-sectional view of a display device according to one embodiment of the present invention.

FIG. 4 is a cross-sectional view of a display device 100b according to one embodiment of the present invention. The display device 100b includes the transparent cover 110, the photovoltaic conversion layer 120, the planarization layer 130, and a display module 140b. The difference between this embodiment and the embodiment shown in FIG. 3 is that the display module 140b further includes a touch module 146. In this embodiment, the touch module 146 is located between the planarization layer 130 and the front light module 144, and may be located between the planarization layer 130 and the electrophoresis module 142. The touch module 146 enables the display device 100b to have a touch function. Electrical power generated by the photovoltaic conversion layer 120 may be delivered to the touch module 146, the electrophoresis module 142, and the front light module 144 for operation. Since the photovoltaic conversion layer 120 is located on the edge region 114 of the transparent cover 110, the image quality of the display region 141 is not affected.

In this embodiment, the planarization layer 130 is located between the touch module 146 and the transparent cover 110. The planarization layer 130 may be adhesive and have UV-cut capability, thereby saving the material and manufacturing costs of the display device 100b.

Moreover, in other embodiments, the touch module 146 may also be located between the front light module 144 and the electrophoresis module 142 as deemed necessary by designers. The display module 140b may have no front light module 144, and only has the touch module 146 and the electrophoresis module 142.

Figure 5:
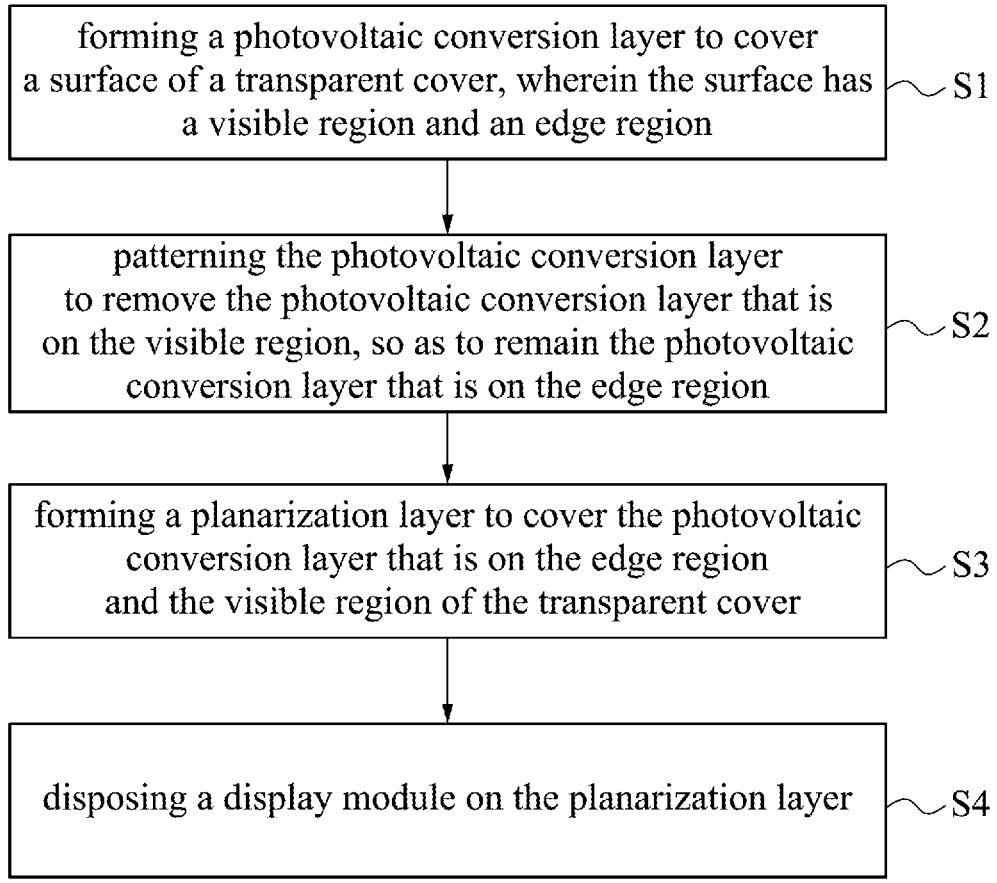
FIG. 5 is a flow chart of a manufacturing method of a display device according to one embodiment of the present invention.

FIG. 5 is a flow chart of a manufacturing method of a display device according to one embodiment of the present invention. The manufacturing method of the display device includes the following steps. In step S1, a photovoltaic conversion layer is formed to cover a surface of a transparent cover, and the surface has a visible region and an edge region. Thereafter, in step S2, the photovoltaic conversion layer is patterned to remove the photovoltaic conversion layer that is on the visible region, so as to remain the photovoltaic conversion layer that is on the edge region. Next, in step S3, a planarization layer is formed to cover the photovoltaic conversion layer that is on the edge region and the visible region of the transparent cover. Thereafter, in step S4, a display module is disposed on the planarization layer.

In the following description, the aforementioned steps will be explained.

Figure 6:
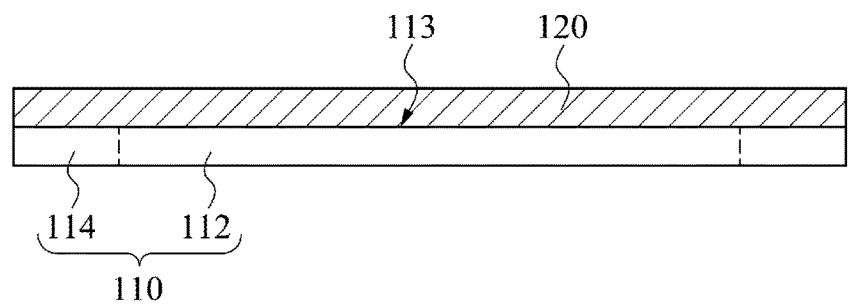
FIG. 6 to FIG. 8 are cross-sectional views showing a manufacturing method of a display device according to one embodiment of the present invention.
Figure 7:
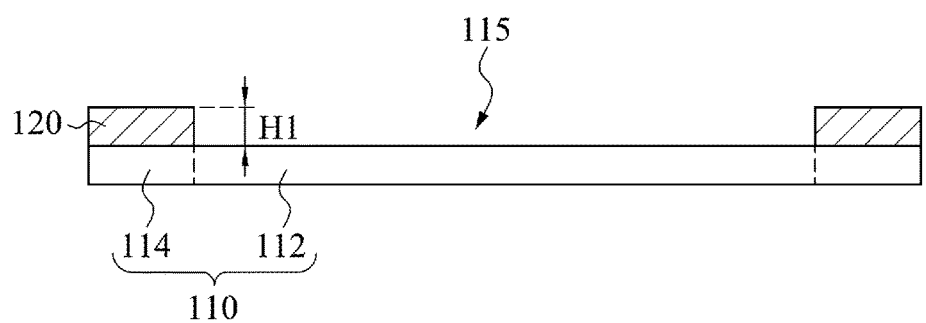
Figure 8:
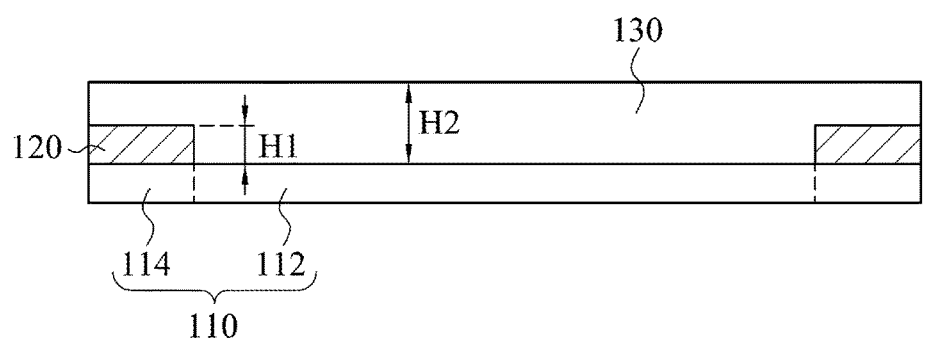

FIG. 6 to FIG. 8 are cross-sectional views showing a manufacturing method of a display device according to one embodiment of the present invention. Referring to FIG. 6, the photovoltaic conversion layer 120 may be formed on the surface 113 of the transparent cover 110, such that the visible region 112 and the edge region 114 of the surface 113 of the transparent cover 110 are covered by the photovoltaic conversion layer 120. The photovoltaic conversion layer 120 may be formed by chemical vapor deposition (CVD) or physical vapor deposition (PVD). Referring to FIG. 7, after the photovoltaic conversion layer 120 covering the surface 113 of the transparent cover 110 is formed, the photovoltaic conversion layer 120 may be patterned to remove the photovoltaic conversion layer 120 that is on the visible region 112, such that the photovoltaic conversion 120 on the edge region 114 is remained. A "patterning" process may include exposure, development, and etching steps in photolithography, but the present invention is not limited in this regard. In another embodiment, the photovoltaic conversion 120 may be directly formed on the edge region 114. In this step, since the photovoltaic conversion 120 on the edge region 114 has a thickness, the stage difference H1 is formed, and the photovoltaic conversion 120 and the transparent cover 110 form the recess 115.

Please refer to FIG. 8. After the photovoltaic conversion 120 on the visible region 112 of the transparent cover 110 is removed, the planarization layer 130 may be formed to cover the photovoltaic conversion layer 120 that is on the edge region 114 and the visible region 112 of the transparent cover 110. Since the thickness H2 of the planarization layer 130 is greater than the stage difference H1, the stage difference H1 and the recess 115 may be filled with the planarization layer 130. After the planarization layer 130 is formed, the display module 140 (see FIG. 2) may be disposed on the planarization layer 130. The material forming the planarization layer 130 is adhesive, and includes UV cut material, and the display module 140 is adhered to the transparent cover 110 through the planarization layer 130.

In addition, the manufacturing method of the display device further includes electrically connecting the photovoltaic conversion layer 120 to the display module 140 (see FIG. 2) through a power management system, such that the photovoltaic conversion layer 120 may provide electrical power to the display module 140 through the power management system. When the display module 140a (see FIG. 3) has the electrophoresis module 142 (see FIG. 3), the manufacturing method of the display device further includes electrically connecting the photovoltaic conversion layer 120 to the electrophoresis module 142 through a power management system, such that the photovoltaic conversion layer 120 may provide electrical power to the electrophoresis module 142 through the power management system. When the display module 140a has the front light module 144 (see FIG. 3), the manufacturing method of the display device further includes electrically connecting the photovoltaic conversion layer 120 to the front light module 144 through a power management system, such that the photovoltaic conversion layer 120 may provide electrical power to the front light module 144 through the power management system. Similarly, when the display module 140b (see FIG. 4) has the touch module 146 (see FIG. 4), the manufacturing method of the display device further includes electrically connecting the photovoltaic conversion layer 120 to the touch module 146 through a power management system, such that the photovoltaic conversion layer 120 may provide electrical power to the touch module 146 through the power management system.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims.

What is claimed is:

1. A display device, comprising:
a transparent cover having a visible region and an edge region;
a photovoltaic conversion layer located on the edge region of the transparent cover, wherein a stage difference is formed by the photovoltaic conversion layer and the visible region of the transparent cover;
a display module electrically connected to the photovoltaic conversion layer; and
a planarization layer located between the display module and the photovoltaic conversion layer, and located between the display module and the visible region of the transparent cover, wherein a thickness of the planarization layer is greater than the stage difference, and the planarization layer below the visible region of the transparent cover is surrounded by the photovoltaic conversion layer.

2. The display device of claim 1, wherein the stage difference is in a range from 1 μm to 5 μm.

3. The display device of claim 1, wherein the thickness of the planarization layer is in a range from 10 μm to 150 μm.

4. The display device of claim 1, wherein a recess is defined by the transparent cover and the photovoltaic conversion layer, and the recess is filled with the planarization layer.

5. The display device of claim 1, wherein the planarization layer is adhesive.

6. The display device of claim 1, wherein the planarization layer is made of a material comprising an ultraviolet (UV) cut material.

7. The display device of claim 1, wherein the display module is a reflective display.

8. The display device of claim 7, wherein the display module comprises:
an electrophoresis module located on a side of the planarization layer facing away from the transparent cover, and electrically connected to the photovoltaic conversion layer through a power management system.

9. The display device of claim 1, further comprising:
a front light module located between the planarization layer and the display module, and electrically connected to the photovoltaic conversion layer through a power management system.

10. The display device of claim 8, further comprising:
a touch module located between the planarization layer and the display module.

11. The display device of claim 1, wherein the transparent cover is made of a glass or polymer material.

12. The display device of claim 1, wherein the photovoltaic conversion layer comprises a plurality of solar cells.

13. The display device of claim 1, wherein a side of the planarization layer facing the transparent cover is level with a side of the photovoltaic conversion layer facing the transparent cover.

* * * * *